(12) United States Patent
Jung et al.

(10) Patent No.: US 12,298,344 B2
(45) Date of Patent: May 13, 2025

(54) LEAKAGE CURRENT DETECTION CIRCUIT

(71) Applicant: SK hynix Inc., Icheon-si (KR)

(72) Inventors: Jong Seok Jung, Icheon-si (KR); Chan Keun Kwon, Icheon-si (KR); Kyeong Hwan Park, Icheon-si (KR); Young Kwan Lee, Icheon-si (KR); Suk Hwan Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 147 days.

(21) Appl. No.: 18/116,090

(22) Filed: Mar. 1, 2023

(65) Prior Publication Data

US 2024/0125848 A1    Apr. 18, 2024

(30) Foreign Application Priority Data

Oct. 13, 2022    (KR) .................. 10-2022-0131579

(51) Int. Cl.
*G01R 31/30*    (2006.01)
*G01R 19/00*    (2006.01)

(52) U.S. Cl.
CPC ..... *G01R 31/3008* (2013.01); *G01R 19/0092* (2013.01)

(58) Field of Classification Search
CPC ................. G01R 31/3008; G01R 19/0092
See application file for complete search history.

(56) References Cited

U.S. PATENT DOCUMENTS

| 7,446,549 | B2 * | 11/2008 | Tomita | G11C 29/50 |
| | | | | 327/63 |
| 10,658,832 | B2 * | 5/2020 | Hashimoto | G01R 31/52 |
| 11,313,900 | B2 * | 4/2022 | Saini | G01R 31/52 |
| 2013/0229213 | A1 | 9/2013 | Park et al. | |

FOREIGN PATENT DOCUMENTS

KR    1020180079903 A    7/2018

\* cited by examiner

*Primary Examiner* — Reena Aurora
(74) *Attorney, Agent, or Firm* — WILLIAM PARK & ASSOCIATES LTD.

(57) ABSTRACT

A leakage current detection circuit includes: a mirror circuit configured to copy a leakage current flowing through a node and generate a copy current in a copy node; an oscillation circuit including a charge storage unit, the oscillation circuit being connected to the copy node, charged with the copy current, and configured to generate an oscillation signal by charging and discharging the charge storage unit; and a calculation circuit configured to calculate an amount of the leakage current based on the oscillation signal.

19 Claims, 9 Drawing Sheets

LEAKAGE CURRENT DETECTION CIRCUIT

CROSS-REFERENCES TO RELATED APPLICATION

The present application claims priority under 35 U.S.C. § 119(a) to Korean application number 10-2022-0131579, filed on Oct. 13, 2022, in the Korean Intellectual Property Office, which is incorporated herein by reference in its entirety.

BACKGROUND

1. Technical Field

The present disclosure relates to an integrated circuit technology, and particularly, to a leakage current detection circuit.

2. Related Art

A defect may occur inside an electronic device and a leakage current may flow. When such a leakage current is generated, an internal operation of the electronic device might not be normally performed and power consumption may also be excessively increased. Therefore, efficiently and accurately detecting the leakage current may be directly related to the operation performance of the device.

SUMMARY

A leakage current detection circuit in accordance with an embodiment of the present disclosure may include: a mirror circuit configured to copy a leakage current flowing through a node and generate a copy current in a copy node; an oscillation circuit including a charge storage unit, the oscillation circuit being connected to the copy node, charged with the copy current, and configured to generate an oscillation signal by charging and discharging the charge storage unit; and a calculation circuit configured to calculate an amount of the leakage current based on the oscillation signal.

A leakage current detection circuit in accordance with an embodiment of the present disclosure may include: a mirror circuit configured to copy a leakage current flowing through a node and generate a copy current, the mirror circuit comprising a feedback loop configured to substantially maintain a voltage of the node as a reference voltage; an oscillation circuit configured to generate an oscillation signal based on the copy current; and a calculation circuit configured to calculate an amount of the leakage current based on the oscillation signal.

A leakage current detection circuit in accordance with an embodiment of the present disclosure may include: a mirror circuit configured to copy a leakage current flowing through a node and generate a copy current in a copy node; an oscillation circuit configured to generate an oscillation signal based on the copy current, the oscillation circuit being operable regardless of a direction of the copy current; and a calculation circuit configured to calculate an amount of the leakage current based on the oscillation signal.

DETAILED DESCRIPTION

Hereinafter, embodiments of the present disclosure will be described in detail with reference to the accompanying drawings.

Various embodiments are directed to providing a leakage current detection circuit capable of detecting a leakage current and efficiently and accurately calculating the amount of the leakage current.

A leakage current detection circuit in accordance with an embodiment of the present disclosure may detect a leakage current and efficiently and accurately calculate the amount of the leakage current.

Figure 1:
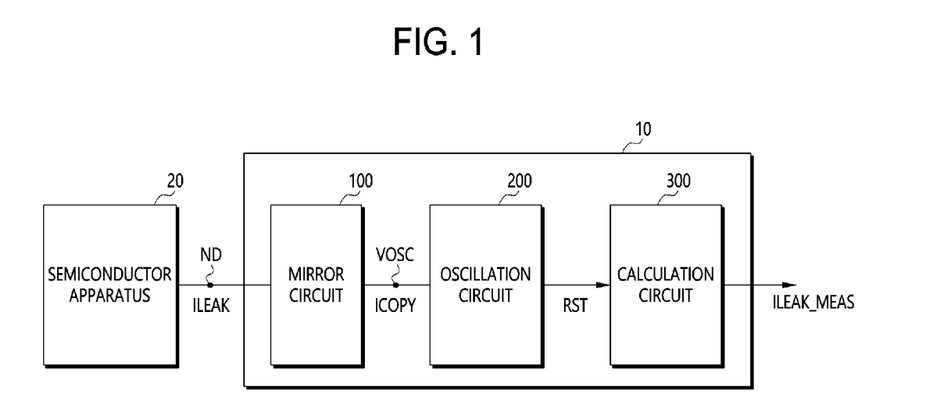
FIG. 1 is a block diagram illustrating a leakage current detection circuit in accordance with an embodiment of the present disclosure.

FIG. 1 is a block diagram illustrating a leakage current detection circuit 10 in accordance with an embodiment of the present disclosure.

Referring to FIG. 1, the leakage current detection circuit 10 may be connected to a semiconductor apparatus 20 through a node ND. The leakage current detection circuit 10 may detect a leakage current ILEAK flowing through the node ND, calculate the amount ILEAK_MEAS of the leakage current ILEAK, and output the current amount ILEAK_MEAS. The semiconductor apparatus 20 may be, for example, a memory apparatus, but is not limited thereto.

The leakage current detection circuit 10 may include a mirror circuit 100, an oscillation circuit 200, and a calculation circuit 300.

The mirror circuit 100 may copy the leakage current ILEAK flowing through the node ND and generate a copy current ICOPY in a copy node VOSC. According to an embodiment, the mirror circuit 100 may include a feedback loop (NFB in FIG. 2) that substantially maintains a voltage of the node ND as a reference voltage (VREF in FIG. 2).

The oscillation circuit 200 may be connected to the copy node VOSC and generate an oscillation signal RST based on the copy current ICOPY. According to an embodiment, the oscillation circuit 200 may include a charge storage unit (CLOAD in FIG. 3) that is charged with the copy current ICOPY and may generate the oscillation signal RST by charging and discharging the charge storage unit.

The calculation circuit 300 may calculate and output the amount ILEAK_MEAS of the leakage current ILEAK based on the oscillation signal RST.

Figure 2:
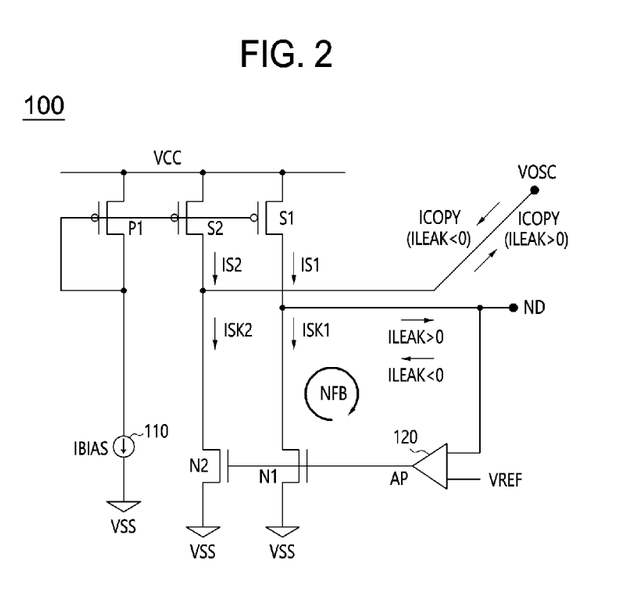
FIG. 2 is a circuit diagram illustrating a mirror circuit in FIG. 1 in accordance with an embodiment of the present disclosure.

FIG. 2 is a circuit diagram illustrating the mirror circuit 100 in FIG. 1 in accordance with an embodiment of the present disclosure.

Referring to FIG. 2, the mirror circuit 100 may include a PMOS transistor P1, a first supply unit S1, a second supply unit S2, a first sink unit N1, a second sink unit N2, and an amplifier 120.

A source of the PMOS transistor P1 may be connected to a voltage supply node VCC. A drain of the PMOS transistor P1 may be connected to a current generation unit 110. A gate of the PMOS transistor P1 may be connected to the drain of the PMOS transistor P1, and thus may have a diode shape.

The first supply unit S1 may supply a first source current IS1 to the node ND. The first supply unit S1 may be implemented as, for example, a PMOS transistor. In this case, a source of the first supply unit S1 may be connected to the voltage supply node VCC. A drain of the first supply unit S1 may be connected to the node ND. A gate of the first supply unit S1 may be connected to the drain of the PMOS transistor P1.

The second supply unit S2 may supply a second source current IS2 to the copy node VOSC. The second supply unit S2 may be implemented as, for example, a PMOS transistor. In this case, a source of the second supply unit S2 may be connected to the voltage supply node VCC. A drain of the second supply unit S2 may be connected to the copy node VOSC. A gate of the second supply unit S2 may be connected to the drain of the PMOS transistor P1.

The amplifier 120 may have two input terminals that are connected to the node ND and a node of the reference voltage VREF, respectively, the amplifier 120 outputting an amplification signal AP. The amplifier 120 may implement a negative feedback loop NFB.

The first sink unit N1 may sink a first sink current ISK1 from the node ND in response to the amplification signal AP. The first sink unit N1 may be implemented as, for example, an NMOS transistor. In this case, a drain of the first sink unit N1 may be connected to the node ND. A source of the first sink unit N1 may be connected to a ground VSS. A gate of the first sink unit N1 may receive the amplification signal AP that is output from the amplifier 120.

The second sink unit N2 may sink a second sink current ISK2 from the copy node VOSC in response to the amplification signal AP. The second sink unit N2 may be implemented as, for example, an NMOS transistor. In this case, a drain of the second sink unit N2 may be connected to the copy node VOSC. A source of the second sink unit N2 may be connected to the ground VSS. A gate of the second sink unit N2 may receive the amplification signal AP that is output from the amplifier 120.

When the current generation unit 110 generates a constant current IBIAS, the drain and the gate of the PMOS transistor P1 may be connected to each other, and thus, substantially the same input voltage may be applied to the gates of the PMOS transistor P1 and the first and second supply units S1 and S2. Accordingly, the first source current IS1 flowing through the drain of the first supply unit S1 and the second source current IS2 flowing through the drain of the second supply unit S2 may flow with substantially the same amount as that of the current IBIAS flowing through the current generation unit 110. When the leakage current ILEAK flows through the node ND that is connected to the semiconductor apparatus 20, the first source current IS1 may be the sum of the leakage current ILEAK and the first sink current ISK1 flowing to the ground VSS through the first sink unit N1. Accordingly, the second sink current ISK2 flowing to the ground VSS through the second sink unit N2 may have substantially the same amount as that of the first sink current ISK1. Thus, the copy current ICOPY having substantially the same direction and amount as those of the leakage current ILEAK may flow through the copy node VOSC. For example, when the leakage current ILEAK flowing in the direction of the node ND, that is, a positive leakage current ILEAK flows through the node ND, the copy current ICOPY flowing in the direction of the copy node VOSC, that is, a positive copy current ICOPY may have substantially the same amount as that of the leakage current ILEAK. For example, when the leakage current ILEAK flowing in a direction from the node ND to the ground VSS, that is, a negative leakage current ILEAK flows through the node ND, the copy current ICOPY flowing in a direction from the copy node VOSC to the ground VSS, that is, a negative copy current ICOPY may have substantially the same amount as that of the leakage current ILEAK.

The mirror circuit 100 may include the feedback loop NFB that receives the voltage of the node ND and the reference voltage VREF and substantially maintains the voltage of the node ND as the reference voltage VREF. More specifically, since the node ND through which the leakage current ILEAK flows is connected to the input terminal of the amplifier 120 and the amplifier 120 implements the negative feedback loop NFB, the node ND may be substantially maintained as the reference voltage VREF that is connected to the other input terminal of the amplifier 120. Accordingly, according to the present disclosure, time variability of the leakage current ILEAK may be eliminated.

Figure 3:
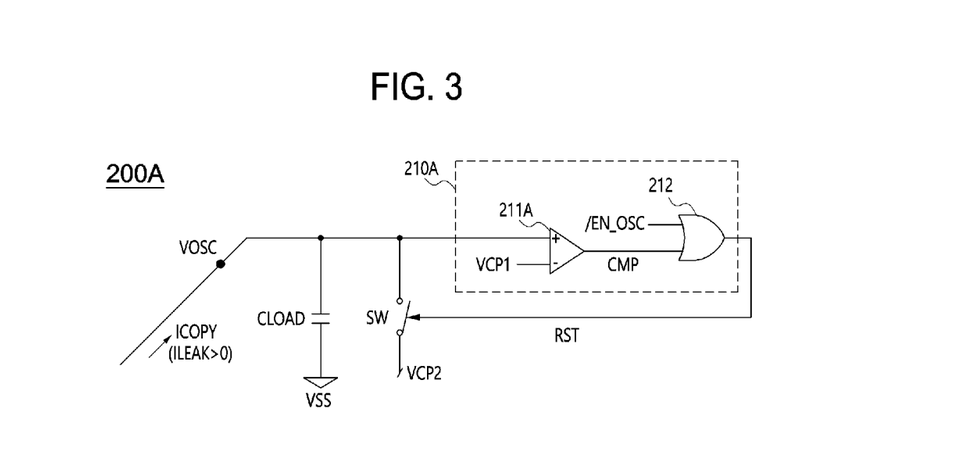
FIG. 3 is a circuit diagram illustrating an oscillation circuit in FIG. 1 in accordance with an embodiment of the present disclosure.

FIG. 3 is a circuit diagram illustrating an oscillation circuit 200A in accordance with an embodiment of the present disclosure. The oscillation circuit 200A may detect a positive leakage current ILEAK. The oscillation circuit 200A may be an example of the oscillation circuit 200 in FIG. 1.

Referring to FIG. 3, the oscillation circuit 200A may include a charge storage unit CLOAD, an oscillation signal output circuit 210A, and a discharge unit SW.

The charge storage unit CLOAD may be connected between the copy node VOSC and the ground VSS. The charge storage unit CLOAD may be charged or discharged with the copy current ICOPY flowing through the copy node VOSC. The charge storage unit CLOAD may include, for example, a capacitor.

The oscillation signal output circuit 210A may output an oscillation signal RST by comparing a voltage of the copy node VOSC with a first comparison voltage VCP1. The oscillation signal output circuit 210A may include a comparator 211A and an activation unit 212.

The comparator 211A may receive the voltage of the copy node VOSC and the first comparison voltage VCP1 and may output a comparison signal CMP. The comparator 211A may compare the voltage of the copy node VOSC with the first comparison voltage VCP1 and may output the comparison signal CMP according to the comparison result. Specifically, the comparator 211A may output a logic-low comparison signal CMP when the voltage level of the copy node VOSC is lower than the first comparison voltage VCP1 and may output a logic-high comparison signal CMP when the voltage of the copy node VOSC is substantially equal to the first comparison voltage VCP1. The first comparison voltage VCP1 may have a higher level than a second comparison voltage VCP2.

The activation unit 212 may receive the comparison signal CMP and an activation signal /EN_OSC and output the oscillation signal RST. The activation signal /EN_OSC may be a signal for activating the leakage current detection circuit 10. For example, the activation signal /EN_OSC may be input at a logic low state in order to activate the leakage current detection circuit 10 and may be input at a logic high state in order to deactivate the leakage current detection circuit 10. The activation unit 212 may output a logic-high oscillation signal RST in response to the logic-high activation signal /EN_OSC. The activation unit 212 may output the comparison signal CMP as the oscillation signal RST in response to the logic-low activation signal /EN_OSC. The activation unit 212 may include, for example, an OR gate.

The discharge unit SW may be connected between the copy node VOSC and a node of the second comparison voltage VCP2. The discharge unit SW may connect the copy node VOSC to the node of the second comparison voltage VCP2 in response to the oscillation signal RST. For example, the discharge unit SW may be closed when the oscillation signal RST is input at a logic-high state and may connect the copy node VOSC to the node of the second comparison voltage VCP2. For example, the discharge unit SW may be opened when the oscillation signal RST is input at a logic-low state and may disconnect the copy node VOSC from the node of the second comparison voltage VCP2. The discharge unit SW may discharge the charge storage unit CLOAD by connecting the copy node VOSC to the node of the second comparison voltage VCP2 in response to the oscillation signal RST.

Figure 4:
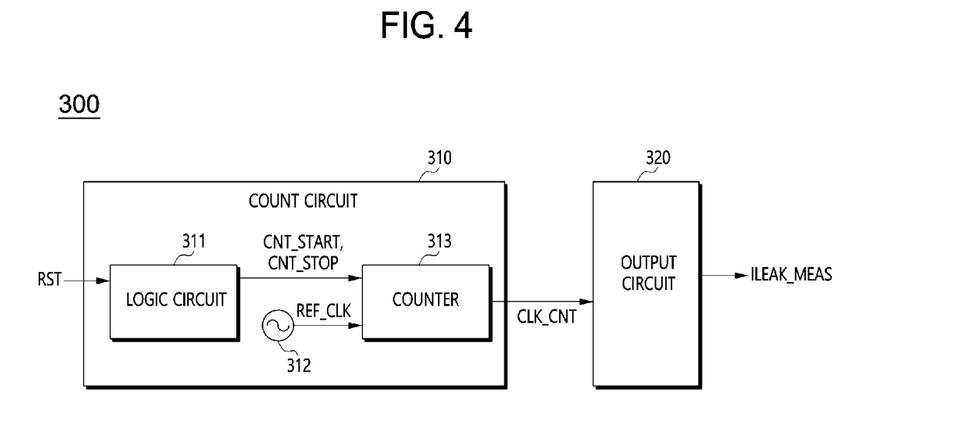
FIG. 4 is a circuit diagram illustrating a calculation circuit in FIG. 1 in accordance with an embodiment of the present disclosure.

FIG. 4 is a circuit diagram illustrating the calculation circuit 300 in FIG. 1 in accordance with an embodiment of the present disclosure.

The calculation circuit 300 may include a count circuit 310 and an output circuit 320.

The count circuit 310 may output a count value CLK_CNT in response to the oscillation signal RST. The output circuit 320 may output the amount ILEAK_MEAS of the leakage current in response to the count value CLK_CNT that is output from the count circuit 310.

The count circuit 310 may include a logic circuit 311, an oscillator 312, and a counter 313.

The logic circuit 311 may receive the oscillation signal RST and output a start signal CNT_START and a stop signal CNT_STOP for counting the oscillation signal RST. The logic circuit 311 may detect an $i^{th}$ ($i \geq 1$) rising edge of the oscillation signal RST and output the start signal CNT_START. The start signal CNT_START may be activated at the $i^{th}$ rising edge of the oscillation signal RST. The logic circuit 311 may detect a $j^{th}$ ($j > i$) rising edge of the oscillation signal RST and output the stop signal CNT_STOP. The stop signal CNT_STOP may be activated at the $j^{th}$ rising edge of the oscillation signal RST.

The oscillator 312 may output a reference clock REF_CLK. According to an embodiment, the oscillator 312 may be a microcontroller clock.

The counter 313 may receive the start signal CNT_START and the stop signal CNT_STOP that are output from the logic circuit 311 and the reference clock REF_CLK that is output from the oscillator 312 and may output the count value CLK_CNT. The counter 313 may count the reference clock REF_CLK from the time that the start signal CNT_START is activated to the time that the stop signal CNT_STOP is activated and may output the count value as the count value CLK_CNT.

The output circuit 320 may receive the count value CLK_CNT that is output from the counter 313 and may output the amount ILEAK_MEAS of the leakage current. The output circuit 320 may calculate the amount ILEAK_MEAS of the leakage current by putting the count value CLK_CNT, the capacitance of the charge storage unit CLOAD, the first comparison voltage VCP1, the second comparison voltage VCP2, the cycle of the reference clock REF_CLK, and the values of i and j into an equation C (capacitance)*V (voltage)=I (current)*t (time). The output circuit 320 may store, in a separate memory (not illustrated), constant values necessary for calculation, that is, the capacitance of the charge storage unit CLOAD, the first comparison voltage VCP1, the second comparison voltage VCP2, the cycle of the reference clock REF_CLK, the values of i and j.

Figure 5:
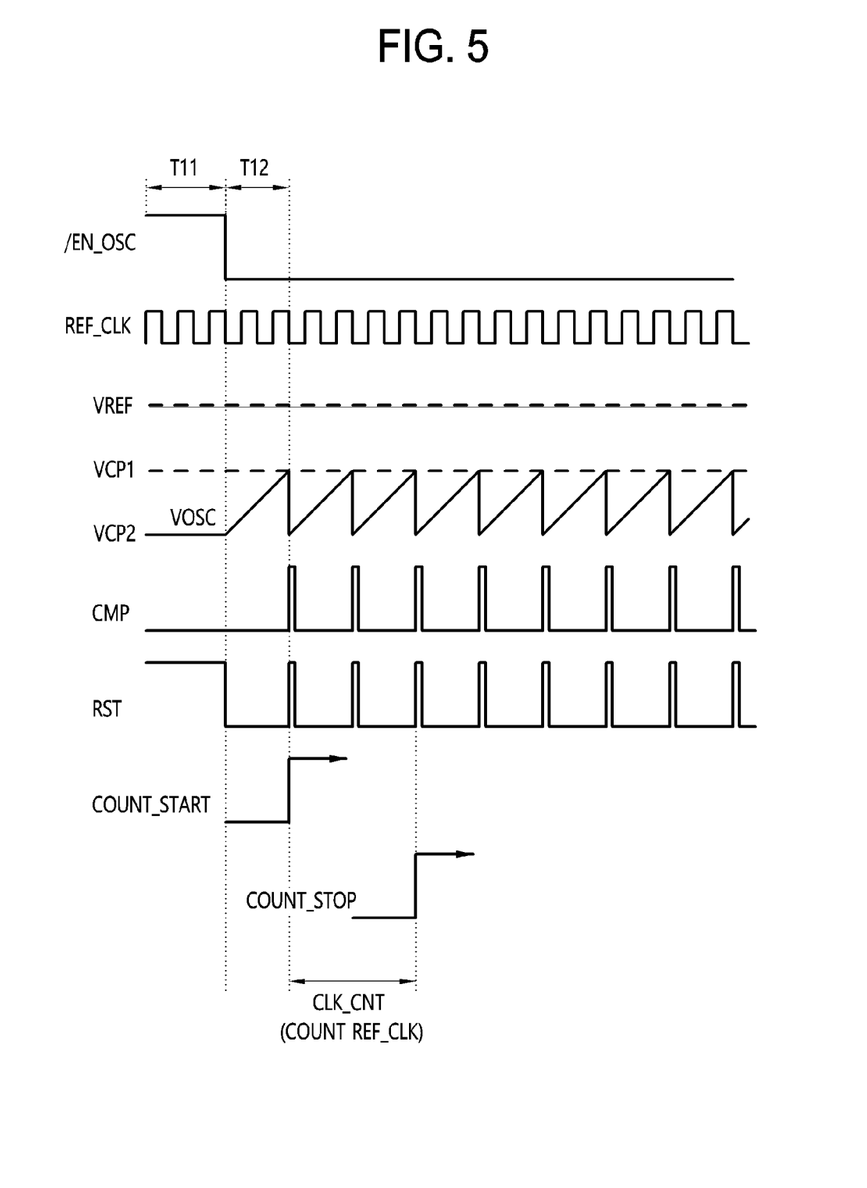
FIG. 5 is a timing diagram illustrating an operation of the leakage current detection circuit in FIG. 1 including the oscillation circuit in FIG. 3 in accordance with an embodiment of the present disclosure.

FIG. 5 is a timing diagram illustrating an operation of the leakage current detection circuit 10 in FIG. 1 including the oscillation circuit 200A in FIG. 3 in accordance with an embodiment of the present disclosure. FIG. 5 is a timing diagram illustrating the operation of the leakage current detection circuit 10 for detecting the positive leakage current ILEAK.

Referring to FIGS. 1 to 5, in a period T11, when the activation signal /EN_OSC is input at a logic high state, the oscillation signal RST may be output at a logic high state by the activation unit 212. Accordingly, the discharge unit SW may connect the copy node VOSC to the node of the second comparison voltage VCP2 in response to the logic-high oscillation signal RST. Thus, the copy node VOSC may have a level of the second comparison voltage VCP2. Since the voltage level of the copy node VOSC is lower than that of the first comparison voltage VCP1, the comparison signal CMP may be output at a logic low state.

In a period T12, when the activation signal /EN_OSC is input at a logic low state, the logic-low comparison signal CMP may be output as a logic-low oscillation signal RST through the activation unit 212 as is. In response to the logic-low oscillation signal RST, the discharge unit SW may disconnect the copy node VOSC from the node of the second comparison voltage VCP2. When the positive leakage current ILEAK is generated in the node ND and the positive copy current ICOPY flows through the copy node VOSC, electric charges may be stored in the charge storage unit CLOAD. Accordingly, when the voltage level of the copy node VOSC rises to the level of the first comparison voltage VCP1, the comparison signal CMP may be output at a logic high state by the comparator 211A, and the oscillation signal RST may be output at a logic high state by the activation unit 212. Since the discharge unit SW connects the copy node VOSC to the node of the second comparison voltage VCP2 in response to the logic-high oscillation signal RST, the voltage level of the copy node VOSC may drop from the level of the first comparison voltage VCP1 to the level of the second comparison voltage VCP2. When the voltage level of the copy node VOSC drops to the level of the second comparison voltage VCP2, the comparison signal CMP may be output at a logic low state by the comparator 211A and the oscillation signal RST may also be output at a logic low state by the activation unit 212.

Then, since the positive copy current ICOPY continues to flow through the copy node VOSC and electric charges are stored in the charge storage unit CLOAD again, the operation of the period T12 described above may be similarly repeated. Accordingly, the oscillation signal RST may be output as a signal oscillating while the positive leakage current ILEAK flows.

The operation of the calculation circuit 300 is described. The start signal CNT_START may be activated at the first (that is, i=1) rising edge of the oscillation signal RST, and the stop signal CNT_STOP may be activated at the third (that is, j=3) rising edge of the oscillation signal RST. The counter 313 may count the reference clock REF_CLK from the time that the start signal CNT_START is activated to the time that the stop signal CNT_STOP is activated, that is, during two cycles of the oscillation signal RST, and may output a count value CLK_CNT.

The output circuit 320 may calculate and output the amount ILEAK_MEAS of the leakage current based on the count value CLK_CNT. For example, when the capacitance C of the charge storage unit CLOAD is 1 pF, the first comparison voltage VCP1 is 0.5 V, the second comparison voltage VCP2 is 1.5 V, the cycle P of the reference clock REF_CLK is 10 ns/Cycle, the count value CLK_CNT is 200, i is 1, and j is 3, the output circuit 320 may calculate the amount ILEAK_MEAS of the leakage current according to the following equation.

$$ILEAK\_MEAS=C*(VREF2-VREF3)/P=1\ pF*1V/\{10\ ns*200/(3-1)\}=1\ uA$$

Figure 6:
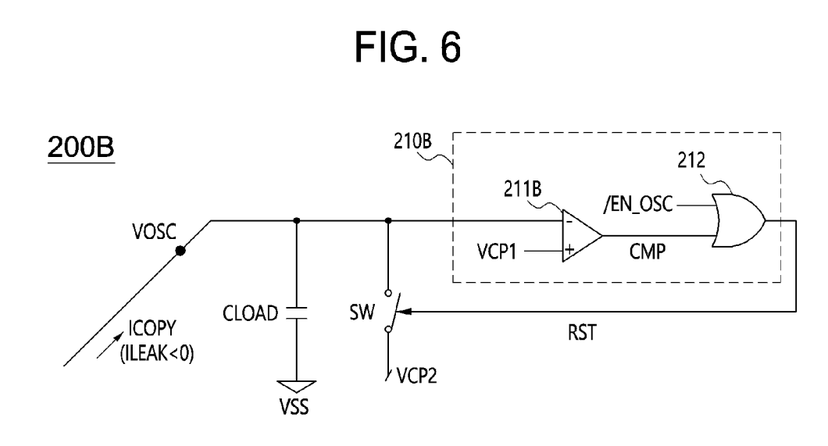
FIG. 6 is a circuit diagram illustrating an oscillation circuit in accordance with an embodiment of the present disclosure.

FIG. 6 is a circuit diagram illustrating an oscillation circuit 200B in accordance with an embodiment of the present disclosure. The oscillation circuit 200B may detect a negative leakage current ILEAK. The oscillation circuit 200B may be an example of the oscillation circuit 200 in FIG. 1.

Referring to FIG. 6, the oscillation circuit 200B may include a charge storage unit CLOAD, an oscillation signal output circuit 21013, and a discharge unit SW. The oscillation signal output circuit 21013 may include a comparator 2118 and an activation unit 212. The configurations and operation methods of the charge storage unit CLOAD, the activation unit 212, and the discharge unit SW may be substantially the same as those described with reference to FIG. 3.

The comparator 2118 may receive the voltage of the copy node VOSC and the first comparison voltage VCP1 and may output a comparison signal CMP. The comparator 2118 may compare the voltage of the copy node VOSC with the first comparison voltage VCP1 and may output the comparison signal CMP according to the comparison result. Specifically, the comparator 2118 may output a logic-low comparison signal CMP when the voltage of the copy node VOSC is greater than the first comparison voltage VCP1 and may output a logic-high comparison signal CMP when the voltage of the copy node VOSC is substantially equal to the first comparison voltage VCP1. The first comparison voltage VCP1 may have a lower level than the second comparison voltage VCP2.

Figure 7:
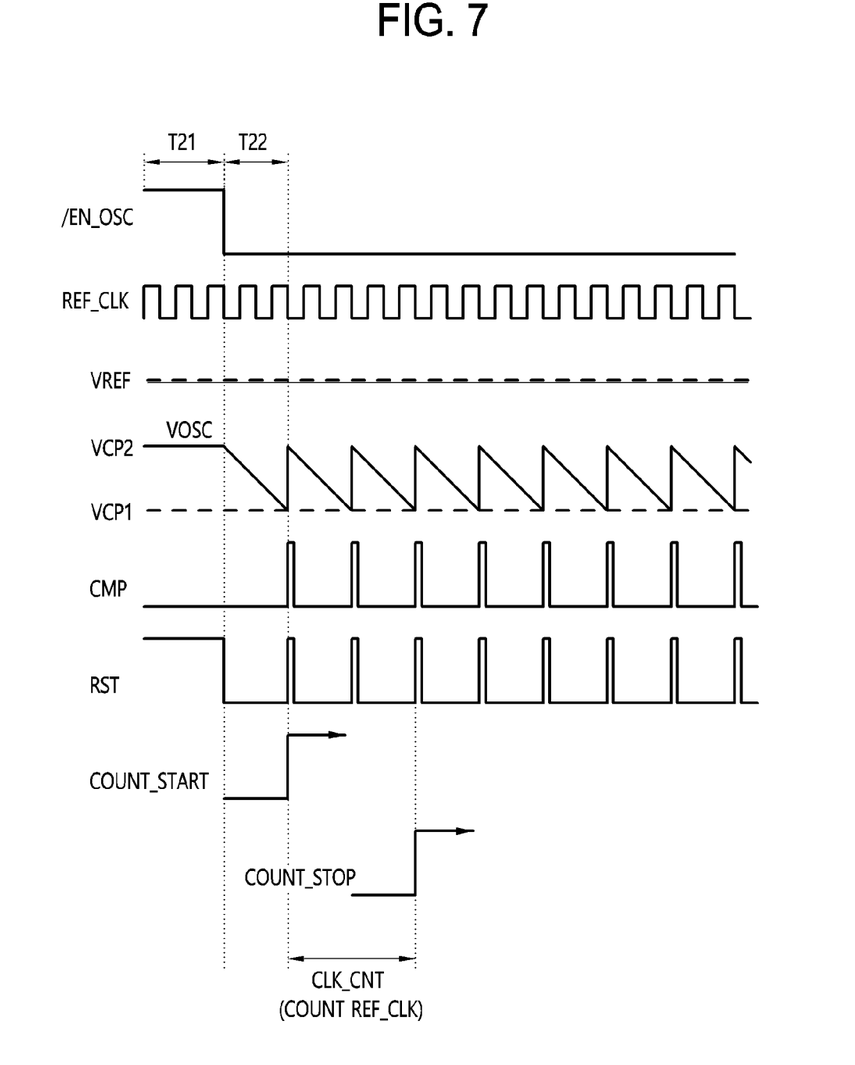
FIG. 7 is a timing diagram illustrating an operation of the leakage current detection circuit including the oscillation circuit in FIG. 6 in accordance with an embodiment of the present disclosure.

FIG. 7 is a timing diagram illustrating an operation of the leakage current detection circuit 10 including the oscillation circuit 200B in FIG. 6 in accordance with an embodiment of the present disclosure. FIG. 7 is a timing diagram illustrating the operation of the leakage current detection circuit 10 for detecting the negative leakage current ILEAK.

Referring to FIGS. 1, 2, 4, 6 and 7, in a period T21, when the activation signal /EN_OSC is input at a logic high state, the oscillation signal RST may be output at a logic high state by the activation unit 212. Accordingly, the discharge unit SW may connect the copy node VOSC to the node of the second comparison voltage VCP2 in response to the logic-high oscillation signal RST. Thus, the copy node VOSC may have a level of the second comparison voltage VCP2. Since the voltage level of the copy node VOSC is higher than that of the first comparison voltage VCP1, the comparison signal CMP may be output at a logic low state.

In a period T22, when the activation signal /EN_OSC is input at a logic high state, the logic-low comparison signal CMP may be output as a logic-low oscillation signal RST through the activation unit 212 as is. In response to the logic-low oscillation signal RST, the discharge unit SW may disconnect the copy node VOSC from the node of the second comparison voltage VCP2. When the negative leakage current ILEAK is generated in the node ND and the negative copy current ICOPY flows through the copy node VOSC, electric charges of the charge storage unit CLOAD may be discharged. Accordingly, when the voltage level of the copy node VOSC drops to the level of the first comparison voltage VCP1, the comparison signal CMP may be output at a logic high state by the comparator 211B, and the oscillation signal RST may be output at a logic high state by the activation unit 212. Since the discharge unit SW connects the copy node VOSC to the node of the second comparison voltage VCP2 in response to the logic-high oscillation signal RST, the voltage level of the copy node VOSC may rise from the level of the first comparison voltage VCP1 to the level of the second comparison voltage VCP2. When the voltage level of the copy node VOSC rises to the level of the second comparison voltage VCP2, the comparison signal CMP may be output at a logic low state by the comparator 211B, and the oscillation signal RST may also be output at a logic low state by the activation unit 212.

Then, since the negative copy current ICOPY continues to flow through the copy node VOSC and electric charges of the charge storage unit CLOAD are discharged again, the operation of the period T22, described above, may be similarly repeated. Accordingly, the oscillation signal RST may be output as a signal oscillating while the negative leakage current ILEAK flows.

The subsequent operation of the calculation circuit 300 based on the oscillation signal RST may be substantially the same as that of the calculation circuit 300 described with reference to FIG. 5.

Figure 8:
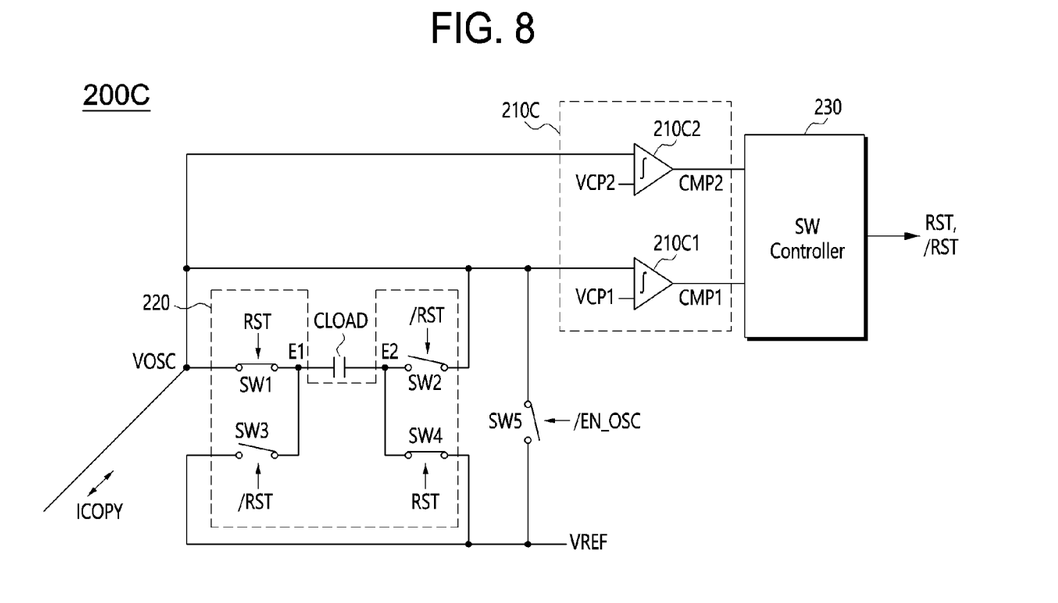
FIG. 8 is a circuit diagram illustrating an oscillation circuit in accordance with an embodiment of the present disclosure.

FIG. 8 is a circuit diagram illustrating an oscillation circuit 200C in accordance with an embodiment of the present disclosure. The oscillation circuit 200C may detect both the positive leakage current ILEAK and the negative leakage current ILEAK. The oscillation circuit 200C may be an example of the oscillation circuit 200 in FIG. 1.

Referring to FIG. 8, the oscillation circuit 200C may include a charge storage unit CLOAD, a comparison unit 210C, a switch unit 220, a switch controller 230, and a fifth switch SW5.

A first electrode E1 of the charge storage unit CLOAD may be connected to a first switch SW1 and a third switch SW3, and a second electrode E2 of the charge storage unit CLOAD may be connected to a second switch SW2 and a fourth switch SW4. The charge storage unit CLOAD may be connected to the copy node VOSC and the reference voltage VREF by the first switch SW1, the second switch SW2, the third switch SW3, and the fourth switch SW4. Specifically, when the first switch SW1 and the fourth switch SW4 are closed in response to a logic-high oscillation signal RST, the first electrode E1 of the charge storage unit CLOAD may be connected to the copy node VOSC, and the second electrode E2 of the charge storage unit CLOAD may be connected to the reference voltage VREF. When the second switch SW2 and the fourth switch SW4 are closed in response to a logic-high oscillation bar signal /RST, the second electrode E2 of the charge storage unit CLOAD may be connected to the copy node VOSC, and the first electrode E1 of the charge storage unit CLOAD may be connected to the reference voltage VREF.

The comparison unit 210C may output a first comparison signal CMP1 and a second comparison signal CMP2 based on the voltage of the copy node VOSC. The comparison unit 210C may include a first comparator 210C1 and a second comparator 210C2.

The first comparator 210C1 may receive the voltage of the copy node VOSC and the first comparison voltage VCP1 and may output the first comparison signal CMP1. The first comparator 210C1 may compare the voltage of the copy node VOSC with the first comparison voltage VCP1 and may output the first comparison signal CMP1 according to the comparison result. The first comparator 210C1 may output a deactivated first comparison signal CMP1, for example, a logic-low first comparison signal CMP1, when the voltage of the copy node VOSC is greater than the first comparison voltage VCP1 and may output an activated first comparison signal CMP1, for example, a logic-high first comparison signal CMP1, when the voltage of the copy node VOSC is substantially equal to the first comparison voltage VCP1.

The second comparator 210C2 may receive the voltage of the copy node VOSC and the second comparison voltage VCP2 and may output the second comparison signal CMP2. The second comparator 210C2 may compare the voltage of the copy node VOSC with the second comparison voltage VCP2 and may output the second comparison signal CMP2 according to the comparison result. The second comparator 210C2 may output a deactivated second comparison signal CMP2, for example, a logic-low second comparison signal CMP2, when the voltage level of the copy node VOSC is lower than the second comparison voltage VCP2 and may output an activated second comparison signal CMP2, for example, a logic-high second comparison signal CMP2, when the voltage of the copy node VOSC is substantially equal to the second comparison voltage VCP2.

According to an embodiment, the first comparison voltage VCP1 may be a voltage having a lower level than the second comparison voltage VCP2. According to an embodiment, the reference voltage VREF may be a voltage having an intermediate level between the level of the first comparison voltage VCP1 and the level of the second comparison voltage VCP2.

The switch unit 220 may connect the charge storage unit CLOAD to a node having the reference voltage VREF and the copy node VOSC in response to the oscillation signal RST. The switch unit 220 may include the first switch SW1, the second switch SW2, the third switch SW3, and the fourth switch SW4.

The first switch SW1 may be connected between the copy node VOSC and the first electrode E1 of the charge storage unit CLOAD. The first switch SW1 may connect or disconnect the copy node VOSC to or from the charge storage unit CLOAD in response to the oscillation signal RST. Specifically, the first switch SW1 may connect the copy node VOSC to the charge storage unit CLOAD in response to a logic-high oscillation signal RST. The first switch SW1 may disconnect the copy node VOSC from the charge storage unit CLOAD in response to a logic-low oscillation signal RST.

The second switch SW2 may be connected between the copy node VOSC and the second electrode E2 of the charge storage unit CLOAD. The second switch SW2 may connect or disconnect the copy node VOSC to or from the charge storage unit CLOAD in response to an oscillation bar signal /RST. Specifically, the second switch SW2 may connect the copy node VOSC to the charge storage unit CLOAD in response to a logic-high oscillation bar signal /RST. The second switch SW2 may disconnect the copy node VOSC from the charge storage unit CLOAD in response to a logic-low oscillation bar signal /RST.

The third switch SW3 may be connected between the node of the reference voltage VREF and the first electrode E1 of the charge storage unit CLOAD. The third switch SW3 may connect or disconnect the node of the reference voltage VREF to or from the charge storage unit CLOAD in response to the oscillation bar signal /RST. Specifically, the third switch SW3 may connect the node of the reference voltage VREF to the charge storage unit CLOAD in response to the logic-high oscillation bar signal /RST. The third switch SW3 may disconnect the node of the reference voltage VREF from the charge storage unit CLOAD in response to the logic-low oscillation bar signal /RST.

The fourth switch SW4 may be connected between the node of the reference voltage VREF and the second electrode E2 of the charge storage unit CLOAD. The fourth switch SW4 may connect or disconnect the node of the reference voltage VREF to or from the charge storage unit CLOAD in response to the oscillation bar signal /RST. Specifically, the fourth switch SW4 may connect the node of the reference voltage VREF to the charge storage unit CLOAD in response to the logic-high oscillation bar signal /RST. The fourth switch SW4 may disconnect the node of the reference voltage VREF from the charge storage unit CLOAD in response to the logic-low oscillation bar signal /RST.

The switch controller 230 may receive the first comparison signal CMP1 and the second comparison signal CMP2 and may output the oscillation signal RST and the oscillation bar signal /RST. The oscillation signal RST and the oscillation bar signal /RST may be oscillating signals and may have opposite phases. The oscillation signal RST and the oscillation bar signal /RST may be output not to overlap each other. The switch controller 230 may invert a phase of the oscillation signal RST whenever any one of the first comparison signal CMP1 and the second comparison signal CMP2 is activated.

The fifth switch SW5 may be connected between the copy node VOSC and the node of the reference voltage VREF. The fifth switch SW5 may connect or disconnect the copy node VOSC to or from the node of the reference voltage VREF in response to the activation signal /EN_OSC. The activation signal /EN_OSC may be a signal for activating the leakage current detection circuit 10. For example, the activation signal /EN_OSC may be input at a logic low state in order to activate the leakage current detection circuit 10, and may be input at a logic high state in order to deactivate the leakage current detection circuit 10. Specifically, the fifth switch SW5 may disconnect the copy node VOSC from the node of the reference voltage VREF in response to the logic-high activation signal /EN_OSC. The fifth switch SW5 may connect the copy node VOSC to the node of the reference voltage VREF in response to the logic-low activation signal /EN_OSC.

The switch controller 230 may output the logic-high oscillation signal RST and the logic-low oscillation bar signal /RST when the activation signal /EN_OSC is input at a logic high state. Then, the switch controller 230 may invert the phases of the oscillation signal RST and the oscillation bar signal /RST whenever any one of the first comparison signal CMP1 that is output from the first comparator 210C1 and the second comparison signal CMP2 that is output from the second comparator 210C2 is activated.

Figure 9A:
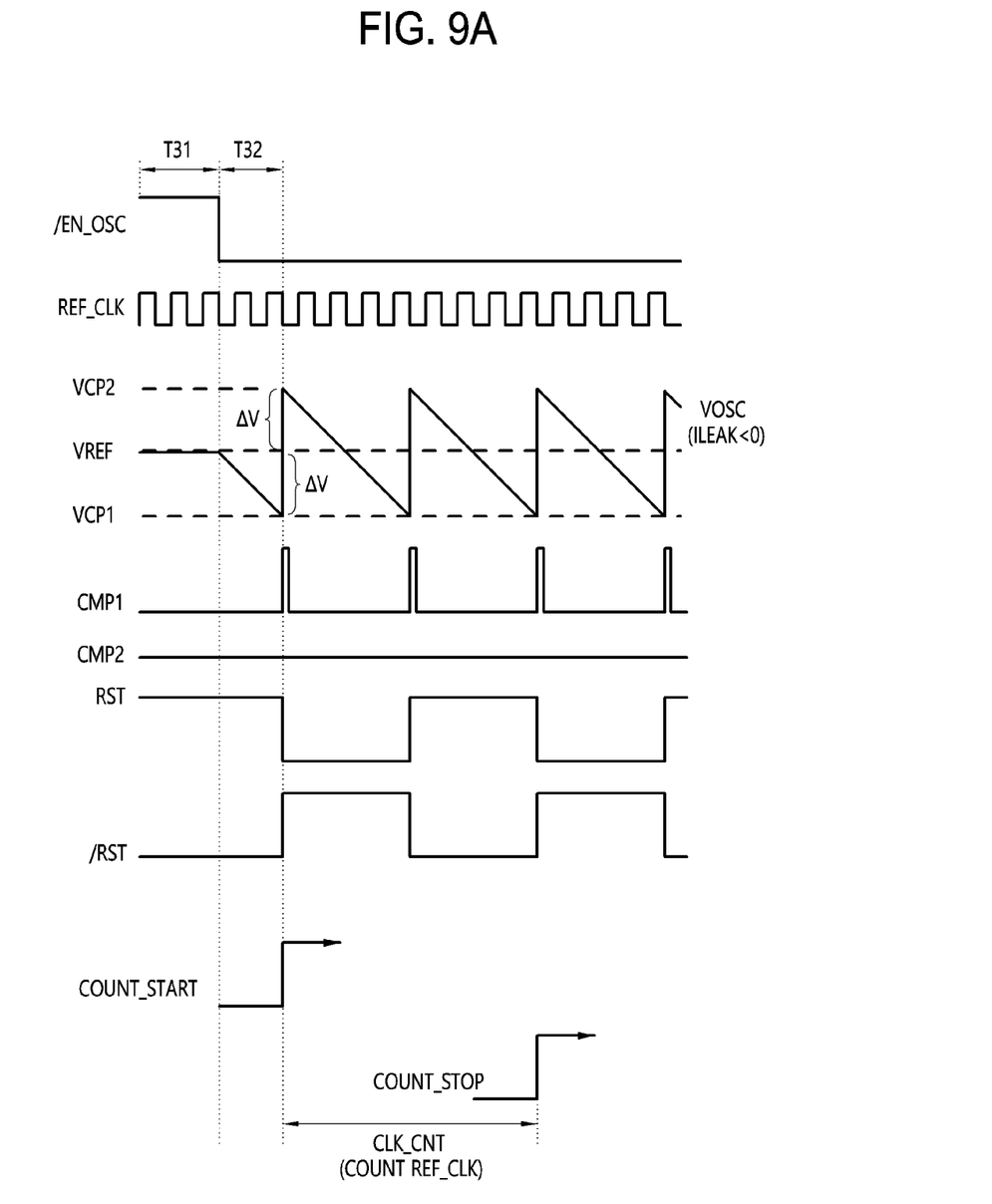
FIG. 9A is a timing diagram illustrating an operation of the leakage current detection circuit including the oscillation circuit in FIG. 8 in accordance with an embodiment of the present disclosure.

FIG. 9A is a timing diagram illustrating an operation of the leakage current detection circuit 10 including the oscillation circuit 200C in FIG. 8 in accordance with an embodiment of the present disclosure. FIG. 9A is a timing diagram illustrating the operation of the leakage current detection circuit 10 when the negative leakage current ILEAK flows.

Referring to FIGS. 1, 2, 4, 8, and 9A, in a period T31, the oscillation signal RST may be output at a logic high state when the activation signal /EN_OSC is input at a logic high state, and the oscillation bar signal /RST may be output at a logic low state because it has a phase opposite to that of the oscillation signal RST.

Since the fifth switch SW5 connects the copy node VOSC to the node of the reference voltage VREF in response to a logic-high activation signal /EN_OSC, the copy node VOSC may have the level of the reference voltage VREF. Since the voltage level of the copy node VOSC, that is, the level of the reference voltage VREF is higher than the level of the first comparison voltage VCP1, the first comparison signal CMP1 may be deactivated, for example, may be output at a logic low state. Furthermore, since the voltage level of the copy node VOSC, that is, the level of the reference voltage VREF is lower than the level of the second comparison voltage VCP2, the second comparison signal CMP2 may be deactivated, for example, may be output at a logic low state.

In a period T32, when the activation signal /EN_OSC is input at a logic low state, the fifth switch SW5 may disconnect the copy node VOSC from the node of the reference voltage VREF. Since the first switch SW1 and the fourth switch SW4 are in a closed state in response to the logic-high oscillation signal RST, the first electrode E1 of the charge storage unit CLOAD may be connected to the copy node VOSC, and the second electrode E2 of the charge storage unit CLOAD may be connected to the node of the reference voltage VREF. In this case, when a negative leakage current ILEAK is generated in the node ND and a negative copy current ICOPY flows through the copy node VOSC, electric charges of the charge storage unit CLOAD may be discharged, and the voltage level of the copy node VOSC may drop. Accordingly, the first electrode of the charge storage unit CLOAD that is connected to the copy node VOSC through the first switch SW1 may have a (−) polarity, and the second electrode of the charge storage unit CLOAD that is connected to the node of the reference voltage VREF through the fourth switch SW4 may have a (+) polarity. When the voltage level of the copy node VOSC drops to the level of the first comparison voltage VCP1 by a voltage ΔV, the first comparison signal CMP1 may be activated by the first comparator 210C1, for example, may be output at a logic high state. The switch controller 230 may receive the activated first comparison signal CMP1, invert the phases of the oscillation signal RST and the oscillation bar signal /RST, and output a logic-low oscillation signal RST and a logic-high oscillation bar signal /RST.

Subsequently, since the oscillation signal RST is output at a logic low state, the first switch and the fourth switch may be opened, and since the oscillation bar signal /RST is output at a logic high state, the second switch and the third switch may be closed. Accordingly, the first electrode and the second electrode of the charge storage unit CLOAD may be oppositely connected. Thus, the polarities of the first electrode and the second electrode may be opposite to each other, that is, the first electrode may have a (+) polarity and the second electrode may have a (−) polarity. As a consequence, the voltage level of the copy node VOSC may rise to the level of the second comparison voltage VCP2 by the voltage ΔV.

Then, since the negative copy current ICOPY continues to flow through the copy node VOSC and electric charges of the charge storage unit CLOAD are discharged, the operation of the period T32 described above may be similarly repeated. Since the switch controller 230 inverts the phases of the oscillation signal RST and the oscillation bar signal /RST whenever receiving the activated first comparison signal CMP1, the oscillation signal RST may be output as a signal oscillating while the negative copy current ICOPY flows. The subsequent operation of the calculation circuit 300 based on the oscillation signal RST may be substantially the same as that of the calculation circuit 300 described with reference to FIG. 5.

Figure 9B:
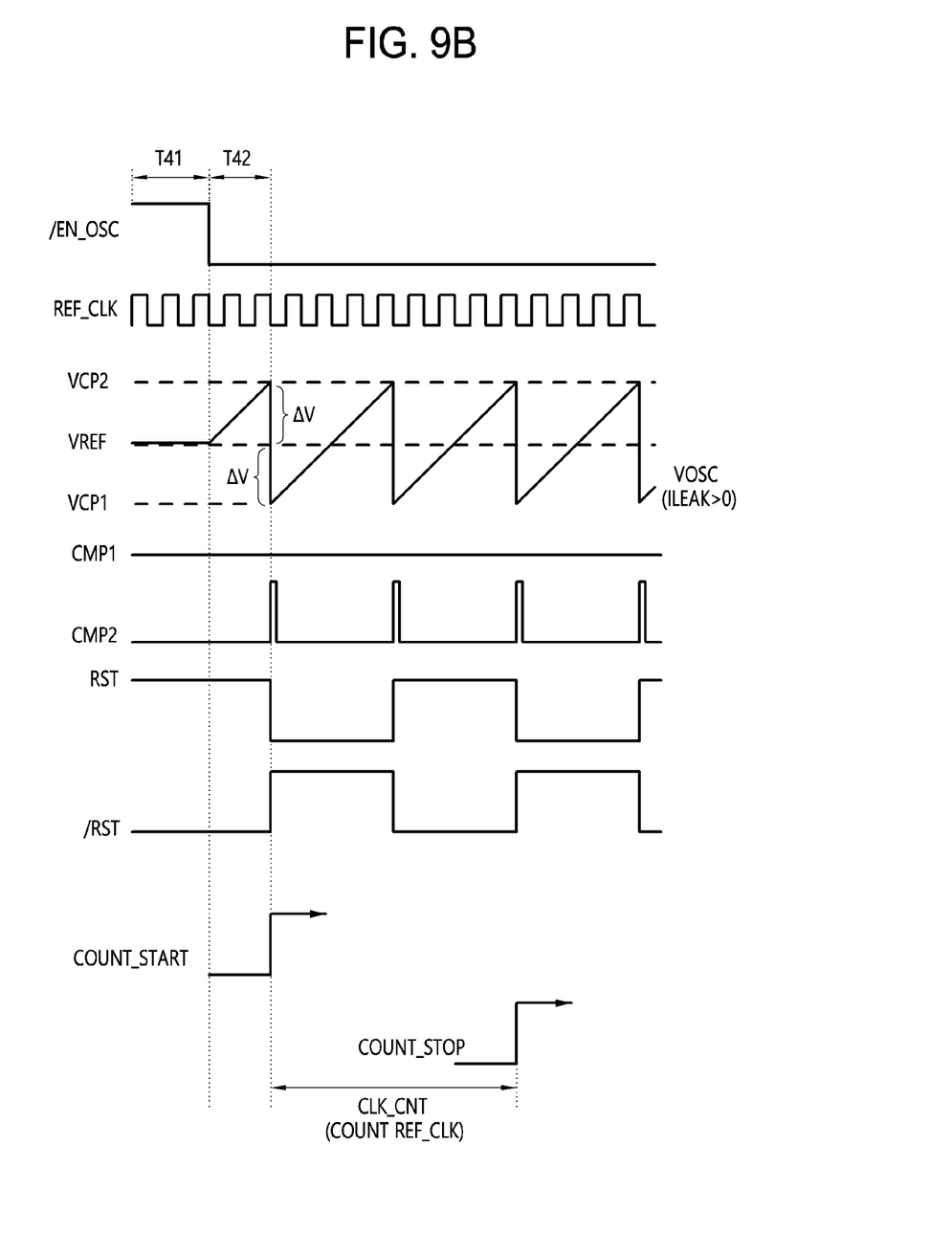
FIG. 9B is a timing diagram illustrating an operation of the leakage current detection circuit including the oscillation circuit in FIG. 8 in accordance with an embodiment of the present disclosure.

FIG. 9B is a timing diagram illustrating an operation of the leakage current detection circuit 10 including the oscillation circuit 200C in FIG. 8 according to an embodiment of the present disclosure. FIG. 9B is a timing diagram illustrating the operation of the leakage current detection circuit 10 when the positive leakage current ILEAK flows.

Referring to FIGS. 1, 2, 4, 8, and 9B, the operation of a period T42 may be substantially the same as the operation of the period T41 in FIG. 9A.

In the period T42, when the activation signal /EN_OSC is input at a logic low state, the fifth switch SW5 may disconnect the copy node VOSC from the node of the reference voltage VREF. Since the first switch SW1 and the fourth switch SW4 are in a closed state in response to the logic-high oscillation signal RST, the first electrode E1 of the charge storage unit CLOAD may be connected to the copy node VOSC and the second electrode E2 of the charge storage unit CLOAD may be connected to the node of the reference voltage VREF. In this case, when the positive leakage current ILEAK is generated in the node ND and the positive copy current ICOPY flows through the copy node VOSC, electric charges may be stored in the charge storage unit CLOAD, and the voltage level of the copy node VOSC may rise. Accordingly, the first electrode of the charge storage unit CLOAD that is connected to the copy node VOSC through the first switch SW1 may have a (+) polarity, and the second electrode of the charge storage unit CLOAD that is connected to the node of the reference voltage VREF through the fourth switch SW4 may have a (−) polarity. When the voltage level of the copy node VOSC rises to the level of the second comparison voltage VCP2 by the voltage ΔV, the second comparison signal CMP2 may be activated by the second comparator 210C2, for example, may be output at a logic high state. The switch controller 230 may receive the activated second comparison signal CMP2, invert the phases of the oscillation signal RST and the oscillation bar signal /RST, and output a logic-low oscillation signal RST and a logic-high oscillation bar signal /RST.

Subsequently, since the oscillation signal RST is output at a logic low state, the first switch and the fourth switch may be opened, and since the oscillation bar signal /RST is output at a logic high state, the second switch and the third switch may be closed. Accordingly, the first electrode and the second electrode of the charge storage unit CLOAD may be oppositely connected. Thus, the polarities of the first electrode and the second electrode may be opposite to each other, that is, the first electrode may have a (−) polarity and the second electrode may have a (+) polarity. As a consequence, the voltage level of the copy node VOSC may drop to the level of the first comparison voltage VCP1 by the voltage ΔV.

Then, since the positive copy current ICOPY continues to flow through the copy node VOSC and electric charges are stored in the charge storage unit CLOAD, the operation of the period T42 described above may be similarly repeated. Since the switch controller 230 inverts the phases of the oscillation signal RST and the oscillation bar signal /RST whenever receiving the activated second comparison signal CMP2, the oscillation signal RST may be output as a signal oscillating while the positive copy current ICOPY flows. The subsequent operation of the calculation circuit 300 based on the oscillation signal RST may be substantially the same as that of the calculation circuit 300 described with reference to FIG. 5.

Accordingly, the leakage current detection circuit 10 in FIG. 1 including the oscillation circuit 200C in FIG. 8, may effectively and accurately calculate the amount ILEAK_MEAS of the leakage current ILEAK regardless of whether the positive leakage current ILEAK or the negative leakage current ILEAK is generated.

Figure 10:
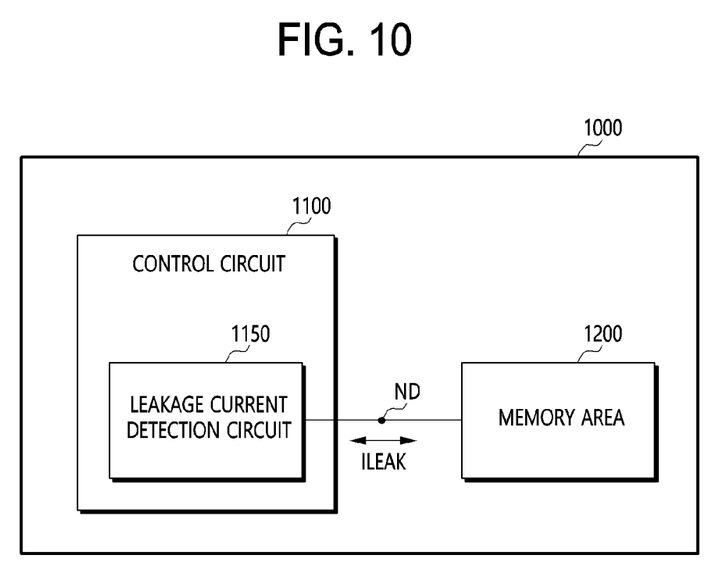
FIG. 10 is a block diagram illustrating a semiconductor apparatus in accordance with an embodiment of the present disclosure.

FIG. 10 is a block diagram illustrating a semiconductor apparatus 1000 in accordance with an embodiment of the present disclosure.

Referring to FIG. 10, the semiconductor apparatus 1000 may include a control circuit 1100 and a memory area 1200.

The control circuit 1100 may control overall operations of the semiconductor apparatus 1000. The control circuit 1100 may perform a program operation, a read operation, an erase operation, and the like on the memory area 1200. The control circuit 1100 may be connected to the memory area 1200 through a node ND.

The control circuit 1100 may include a leakage current detection circuit 1150. The leakage current detection circuit 1150 may be configured and may operate in substantially the same manner as the leakage current detection circuit 10 in FIG. 1. The leakage current detection circuit 1150 may be connected to the memory area 1200 through the node ND, detect a leakage current ILEAK generated in the node ND, and calculate the amount of the leakage current ILEAK.

The control circuit 1100 may limit the use of a portion of the memory area 1200 in which the leakage current ILEAK is generated based on the amount of the leakage current ILEAK that is calculated by the leakage current detection circuit 1150. For example, the control circuit 1100 may recognize the generation of the leakage current ILEAK through the leakage current detection circuit 1150 while performing a program operation on a certain memory block included in the memory area 1200. When determining that the amount of the leakage current ILEAK that is calculated by the leakage current detection circuit 1150 exceeds a predetermined threshold, the control circuit 1100 may designate the memory block as a bad block and might not use the memory block.

The memory area 1200 may include memory cells for storing data under the control of the control circuit 1100. The node ND may be connected to driving lines for controlling the memory cells. When the leakage current ILEAK flows through a certain driving line, a program operation, a read operation, and an erase operation on a memory cell that is connected to the driving line might not be normally performed. However, the leakage current ILEAK may be effectively detected by the leakage current detection circuit 1150.

Accordingly, a yield may be increased in the manufacturing stage of the semiconductor apparatus 1000. Moreover, reliability of the semiconductor apparatus 1000 may be improved, and operational performance of the semiconductor apparatus 1000 may be improved by blocking a leakage current path.

The above description is merely intended to illustratively describe the technical spirit of the present disclosure, and various changes and modifications can be made by those skilled in the art to which the present disclosure pertains without departing from the essential features of the present disclosure. Therefore, the embodiments disclosed in the present disclosure are not intended to limit the technical spirit of the present disclosure but are intended to describe the present disclosure. The scope of the technical spirit of the present disclosure is not limited by these embodiments. The scope of the present disclosure should be interpreted by the accompanying claims and all technical spirits falling within the equivalent scope thereto should be interpreted as being included in the scope of the present disclosure.

What is claimed is:

1. A leakage current detection circuit comprising:
   a mirror circuit configured to copy a leakage current flowing through a node and generate a copy current in a copy node;
   an oscillation circuit configured to generate an oscillation signal based on the copy current; and
   a calculation circuit configured to count a reference clock in response to the oscillation signal and calculate an amount of the leakage current based on a count value of the reference clock,
   wherein the oscillation circuit includes:
   a charge storage unit being connected to the copy node and configured to be charged with the copy current;
   a discharge unit configured to discharge the charge storage unit in response to the oscillation signal; and
   an oscillation signal output circuit configured to generate the oscillation signal by comparing a voltage of the copy node, which is changed by charging and discharging of the charge storage unit, with a first comparison voltage.

2. The leakage current detection circuit according to claim 1, wherein the mirror circuit comprises:
   a feedback loop configured to receive a voltage of the node and a reference voltage and substantially maintain the voltage of the node as the reference voltage.

3. The leakage current detection circuit according to claim 2, wherein the feedback loop comprises:
   an amplifier configured to receive the voltage of the node and the reference voltage and output an amplification signal; and
   a first sink unit connected to the node and configured to sink a first sink current from the node in response to the amplification signal.

4. The leakage current detection circuit according to claim 3, wherein the mirror circuit further comprises:
   a first supply unit connected to the node and configured to supply a first source current to the node;
   a second supply unit connected to the copy node and configured to supply a second source current to the copy node; and
   a second sink unit connected to the copy node and configured to sink a second sink current from the copy node in response to the amplification signal.

5. The leakage current detection circuit according to claim 4, wherein the mirror circuit further comprises:
a current generation unit configured to output a constant current; and
a PMOS transistor including a drain terminal connected to the current generation unit, a gate terminal connected to the drain terminal, and a source terminal connected to a voltage supply node,
wherein a gate terminal of the first supply unit and a gate terminal of the second supply unit are connected in common to the drain terminal of the PMOS transistor.

6. The leakage current detection circuit according to claim 5, wherein an amount of the first source current and an amount of the second source current are identical to an amount of the constant current.

7. The leakage current detection circuit according to claim 4, wherein an amount of the first sink current is obtained by subtracting the amount of the leakage current from an amount of the first source current.

8. The leakage current detection circuit according to claim 4, wherein an amount of the second sink current is identical to an amount of the first sink current.

9. The leakage current detection circuit according to claim 1, wherein the oscillation signal output circuit comprises:
a comparator configured to compare the voltage of the copy node and the first comparison voltage and output a comparison signal; and
an activation unit configured to output the comparison signal as the oscillation signal in response to an activation signal.

10. The leakage current detection circuit according to claim 1, wherein the discharge unit discharges the charge storage unit by connecting the copy node to a node of a second comparison voltage in response to the oscillation signal.

11. The leakage current detection circuit according to claim 1, wherein the charge storage unit comprises a capacitor with a first terminal connected to the copy node and a second terminal connected to a ground node.

12. The leakage current detection circuit according to claim 1, wherein the calculation circuit comprises:
a count circuit configured to count the reference clock at a predetermined cycle of the oscillation signal and output the count value; and
an output circuit configured to calculate the amount of the leakage current based on the count value.

13. The leakage current detection circuit according to claim 12, wherein the count circuit comprises:
a logic circuit configured to output a start signal and a stop signal in response to the oscillation signal;
an oscillator configured to output the reference clock; and
a counter configured to output the count value in response to the start signal, the stop signal, and the reference clock.

14. A semiconductor apparatus comprising:
a memory area; and
a leakage current detection circuit connected to the memory area through a node,
wherein the leakage current detection circuit includes:
a mirror circuit configured to copy a leakage current flowing through the node and generate a copy current in a copy node;
an oscillation circuit configured to generate an oscillation signal based on the copy current; and
a calculation circuit configured to count a reference clock in response to the oscillation signal and calculate an amount of the leakage current based on a count value of the reference clock, and
wherein the oscillation circuit includes:
a charge storage unit being connected to the copy node and configured to be charged with the copy current;
a discharge unit configured to discharge the charge storage unit in response to the oscillation signal; and
an oscillation signal output circuit configured to generate the oscillation signal by comparing a voltage of the copy node, which is changed by charging and discharging of the charge storage unit, with a first comparison voltage.

15. A leakage current detection circuit comprising:
a mirror circuit configured to copy a leakage current flowing through a node and generate a copy current in a copy node;
an oscillation circuit configured to generate an oscillation signal based on the copy current; and
a calculation circuit configured to count a reference clock in response to the oscillation signal and calculate an amount of the leakage current based on a count value of the reference clock,
wherein the oscillation circuit includes:
a charge storage unit;
a switch unit configured to connect the charge storage unit to a node having a reference voltage and the copy node in response to the oscillation signal;
a comparison unit configured to compare a voltage of the copy node with a first comparison voltage to output a first comparison signal and configured to compare the voltage of the copy node with a second comparison voltage to output a second comparison signal; and
a switch controller configured to generate the oscillation signal in response to the first comparison signal and the second comparison signal.

16. The leakage current detection circuit according to claim 15, wherein the comparison unit comprises:
a first comparator configured to compare the voltage of the copy node with a first comparison voltage and output the first comparison signal; and
a second comparator configured to compare the voltage of the copy node with a second comparison voltage and output the second comparison signal.

17. The leakage current detection circuit according to claim 15, wherein the switch unit comprises:
a first switch and a second switch configured to connect the copy node to the charge storage unit in response to the oscillation signal; and
a third switch and a fourth switch configured to connect the node having the reference voltage and the charge storage unit in response to an oscillation bar signal in which the oscillation signal is inverted.

18. The leakage current detection circuit according to claim 15, wherein the switch controller inverts a phase of the oscillation signal whenever any one of the first comparison signal and the second comparison signal is activated.

19. The leakage current detection circuit according to claim 15, wherein the oscillation circuit further comprises:
a switch configured to connect or disconnect the copy node and a node having a reference voltage in response to an activation signal.

* * * * *